US011515160B2

(12) United States Patent
Ko

(10) Patent No.: US 11,515,160 B2
(45) Date of Patent: Nov. 29, 2022

(54) SUBSTRATE PROCESSING METHOD USING MULTILINE PATTERNING

(71) Applicant: Tokyo Electron Limited, Tokyo (JP)

(72) Inventor: Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 264 days.

(21) Appl. No.: 16/836,239

(22) Filed: Mar. 31, 2020

(65) Prior Publication Data

US 2020/0328082 A1  Oct. 15, 2020

Related U.S. Application Data

(60) Provisional application No. 62/833,335, filed on Apr. 12, 2019.

(51) Int. Cl.
*H01L 21/033* (2006.01)
*C23C 14/34* (2006.01)
(Continued)

(52) U.S. Cl.
CPC .......... *H01L 21/0338* (2013.01); *C23C 14/34* (2013.01); *G03F 7/167* (2013.01);
(Continued)

(58) Field of Classification Search
CPC ............. H01L 21/0335; H01L 21/0337; H01L 21/0338; H01L 21/3086; H01L 21/3065;
(Continued)

(56) References Cited

U.S. PATENT DOCUMENTS 8,906,807 B2   12/2014   Bergendahl et al.
2015/0140799 A1   5/2015   Cheng et al.
(Continued)

FOREIGN PATENT DOCUMENTS

WO   2018182717 A1   10/2018

OTHER PUBLICATIONS

Korean Intellectual Property Office, The International Search Report and the Written Opinion for International application No. PCT/US2020/025976, dated Jul. 28, 2020, 10 pg.

*Primary Examiner* — Dale E Page
*Assistant Examiner* — Quovaunda Jefferson
(74) *Attorney, Agent, or Firm* — Slater Matsil, LLP

(57) ABSTRACT

A method includes providing a substrate including mandrels of a first material positioned on an underlying layer. Each of the mandrels includes a first sidewall and an opposing second sidewall. The method further includes forming sidewall spacers made of a second material and including a first sidewall spacer abutting each respective first sidewall and a second sidewall spacer abutting each respective second sidewall. The mandrels extend above top surfaces of the sidewall spacers. The method also includes forming first capped sidewall spacers by depositing a third material on the first sidewall spacers without depositing on the second sidewall spacers, forming second capped sidewall spacers by depositing a fourth material on the second sidewall spacers without depositing on the first sidewall spacers, and selectively removing at least one of the first material, the second material, the third material, and the fourth material to uncover an exposed portion of the underlying layer.

20 Claims, 11 Drawing Sheets

Cross Sectional View

Top View

(51) Int. Cl.
*G03F 7/20* (2006.01)
*H01L 29/66* (2006.01)
*G03F 7/16* (2006.01)
*G03F 7/30* (2006.01)

(52) U.S. Cl.
CPC ................ *G03F 7/30* (2013.01); *G03F 7/70* (2013.01); *H01L 21/0335* (2013.01); *H01L 21/0337* (2013.01); *H01L 29/66795* (2013.01)

(58) Field of Classification Search
CPC ......... H01L 21/3088; H01L 21/823431; H01L 29/66795; C23C 14/04; C23C 14/34; C23C 14/225; G03F 7/167; G03F 7/30; G03F 7/70
See application file for complete search history.

(56) References Cited

U.S. PATENT DOCUMENTS

| | | |
|---|---|---|
| 2018/0005898 A1 | 1/2018 | Cheng et al. |
| 2018/0076033 A1* | 3/2018 | Bergendahl ......... H01L 21/0338 |

* cited by examiner

Cross Sectional View    Top View

Cross Sectional View    Top View

Cross Sectional View

Top View

Cross Sectional View

Cross Sectional View

Cross Sectional View

Cross Sectional View

Cross Sectional View

Cross Sectional View

Top View

Cross Sectional View
A-A'

Cross Sectional View
B-B'

SUBSTRATE PROCESSING METHOD USING MULTILINE PATTERNING

CROSS REFERENCE TO RELATED APPLICATIONS

This application claims priority to U.S. Provisional Application No. 62/833,335, filed on Apr. 12, 2019, which application is hereby incorporated by reference in its entirety.

BACKGROUND OF THE INVENTION

The present invention relates generally to substrate processing, and, in particular embodiments, to methods of patterning substrates and to structures, apparatuses, and systems formed and utilized therein.

Methods of shrinking line-widths in lithographic processes have historically involved using optics with larger numerical apertures (NA), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers typically includes the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure of actinic radiation through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. The mask layer may include multiple sub-layers.

Conventional lithographic techniques for exposing a pattern of radiation or light onto a substrate have various challenges that limit exposed feature size and pitch (i.e. spacing) between exposed features. One conventional technique is to mitigate exposure limitations by using DP approaches to allow the patterning of smaller features at a smaller pitch than is possible using lithographic techniques with only a single exposure.

SUMMARY

In accordance with an embodiment of the invention, a method of patterning a substrate includes providing a substrate including mandrels made of a first material and positioned on an underlying layer. Each of the mandrels includes a first sidewall and a second sidewall opposite the first sidewall. The method further includes forming sidewall spacers made of a second material and including a first sidewall spacer abutting each respective first sidewall and a second sidewall spacer abutting each respective second sidewall. The mandrels extend vertically above top surfaces of the sidewall spacers. The method also includes forming first capped sidewall spacers by depositing a third material on the top surfaces of the first sidewall spacers without depositing the third material on the second sidewall spacers, forming second capped sidewall spacers by depositing a fourth material on the top surfaces of the second sidewall spacers without depositing the fourth material on the first sidewall spacers, forming a patterned mask layer on a multiline layer to mask a portion of the multiline layer, and selectively removing at least one of the first material, the second material, the third material, and the fourth material to uncover an exposed portion of the underlying layer. The mandrels, first capped sidewall spacers and second capped sidewall spacers together define the multiline layer.

In accordance with another embodiment of the invention, a method of patterning a substrate includes providing a substrate comprising mandrels made of a first material and positioned on an underlying layer. Each of the mandrels includes a first sidewall and a second sidewall opposite the first sidewall. The method further includes forming sidewall spacers made of a second material and comprising a first sidewall spacer abutting each respective first sidewall and a second sidewall spacer abutting each respective second sidewall. The mandrels extend vertically above top surfaces of the sidewall spacers. The method also includes forming first capped sidewall spacers by depositing a third material on the top surfaces of the first sidewall spacers without depositing the third material on the second sidewall spacers, forming second capped sidewall spacers by depositing a fourth material on the top surfaces of the second sidewall spacers without depositing the fourth material on the first sidewall spacers, depositing a fifth material over the substrate, forming a patterned mask layer on the multiline layer to mask a portion of a multiline layer, and selectively removing at least one of the first material, the second material, the third material, the fourth material, and the fifth material to uncover an exposed portion of the underlying layer. The fifth material covers exposed portions of the underlying layer between the first capped sidewall spacers and second capped sidewall spacers of adjacent mandrels to form lines of the fifth material. The mandrels, first capped sidewall spacers, second capped sidewall spacers, and the lines of the fifth material together define the multiline layer In accordance with still another embodiment of the invention, a method of patterning a substrate includes providing a substrate comprising mandrels made of a first material and positioned on an underlying layer. Each of the mandrels includes a first sidewall and a second sidewall opposite the first sidewall. The method further includes forming sidewall spacers made of a second material and comprising a first sidewall spacer abutting each respective first sidewall and a second sidewall spacer abutting each respective second sidewall. The mandrels extend vertically above top surfaces of the sidewall spacers. The method also includes forming first capped sidewall spacers by depositing a third material on the top surfaces of the first sidewall spacers without depositing the third material on the second sidewall spacers, forming second capped sidewall spacers by depositing a fourth material on the top surfaces of the second sidewall spacers without depositing the fourth material on the first sidewall spacers, depositing a fifth material over the substrate, cutting lines defined by the first capped sidewall spacers using a first patterned mask layer formed on the multiline layer, and selectively removing at least one of the first material, the second material, the third material, the fourth material, and the fifth material to uncover an exposed portion of the underlying layer. The fifth material covers exposed portions of the underlying layer between the first capped sidewall spacers and second capped sidewall spacers of adjacent mandrels to form lines of the fifth material. The mandrels, first capped sidewall spacers, second capped sidewall spacers, and the lines of the fifth material together define a multiline layer.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A shows a conformal spacer material deposited over mandrels positioned on an underlying layer, FIG. 1B shows the mandrels after etching of the conformal spacer material, FIG. 1C shows a first capping material formed on a first side of the mandrels using an oblique angle deposition, FIG. 1D shows a second capping material formed on a second side of the mandrels using an oblique angle deposition, and FIG. 1E shows a filler material formed in spaces between adjacent sidewall spacers;

FIG. 5A shows cuts made in a multiline pattern and FIG. 5B shows the resulting pattern transferred to the underlying layer;

Figure 1A:
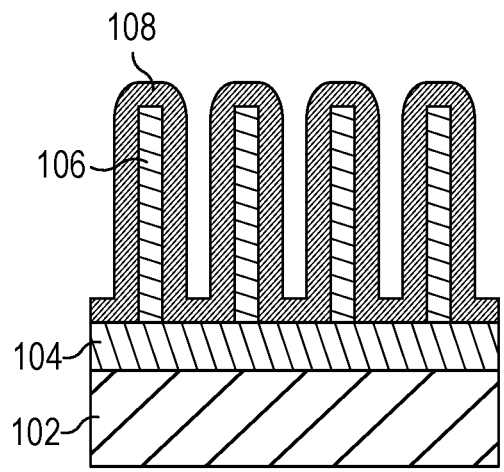
FIGS. 1A-1E illustrate an example process of patterning a substrate in accordance with an embodiment of the invention, where
Figure 1A:
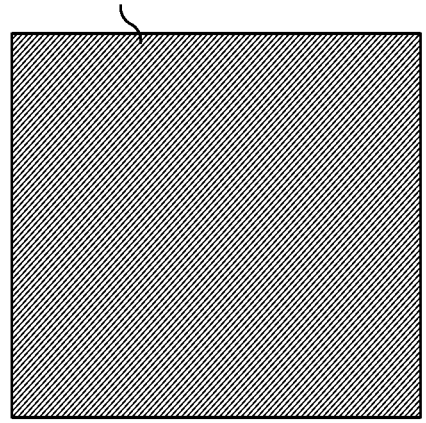

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Of course, the order of discussion of different steps as described herein is presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Although several patterning techniques exist to increase pattern density or pitch density, conventional patterning techniques suffer from poor resolution and/or rough surfaces of etched features. Thus, conventional techniques cannot provide the level of uniformity and fidelity desired for very small dimensions (e.g. 20 nm and smaller). Reliable conventional lithographic techniques can produce features having a pitch of about 80 nm. Current and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photolithography systems.

In various embodiments, a method of processing a substrate includes forming a multiline layer of alternating materials. Each material may have a different etch resistivity (i.e. "color"). The method includes forming sidewall spacers on a mandrel, and depositing separate materials on each side of the mandrels using oblique angle sputter deposition. A fill material can then be deposited to fill spaces between sidewall spacers. The resulting multiline layer can then be used with various etch patterns.

One embodiment includes forming a multiline layer of alternating materials. Each material can have a different etch resistivity. accordingly, a given etch chemistry can etch one or more materials without etching other materials. Lines of alternating material can be formed by first forming a mandrel. A conformal material is deposited on the mandrel and a spacer etch-back or spacer open results in sidewall spacers.

Spacers typically have an angled or curved top surface that is below a top surface of the mandrel top surface. A first deposition is executed at an oblique angle, depositing on spacer top surfaces on one side of the mandrel. A second deposition is executed at an oblique angle, depositing on spacer top surfaces on the opposite side of the mandrel. A fill material can then be deposited to fill spaces between sidewall spacers. The resulting multi-line layer can then be used with various etch patterns.

Mandrels are formed on a substrate, such as a semiconductor wafer. Mandrels can be directly patterned, or can be the result of a multi-patterning process such as self-aligned double patterning (SADP), self-aligned quadruple patterning (SAQP), and self-aligned octuple-patterning (SAOP). Initial patterns can be exposed by a photolithography system using 193 nm wavelength and immersion scanning, extreme ultraviolet (EUV) lithography, or other photolithography system. Thus, the mandrels can be directly printed, or can be the result of pattern density multiplication. Mandrels can be any of various materials including hardmask material, spin on carbon (SOC) and photoresist.

Techniques disclosed herein may advantageously provide methods and processes for pitch reduction (increasing pitch/feature density), for creating high-resolution features, and also for on pitch cutting of sub-resolution features. Techniques herein include forming a multiline layer of materials of different etch resistivities. Etch mask combinations can be used to make cuts first followed by creating fins of fin field-effect transistors (FinFETS), line segments, or other structures. With cuts and fins being defined by multiple different material types—rather than being defined only by a photomask—cuts may be advantageously self-aligned to fins to create fin arrays or other structural arrays that have better process margins as compared to conventional techniques for making fins.

Figure 1B:
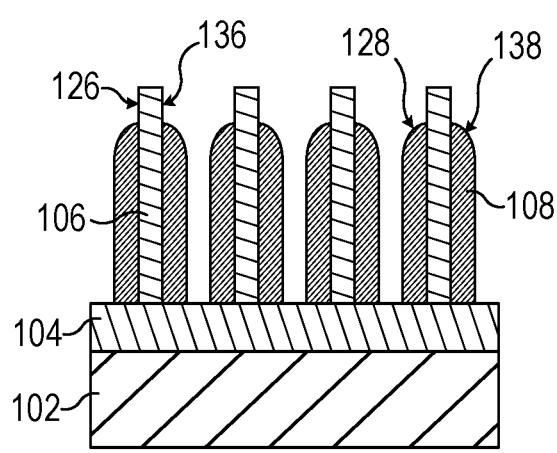
Figure 1B:
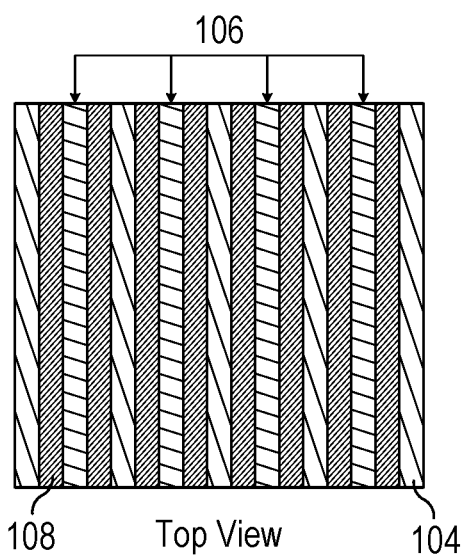
Figure 1C:
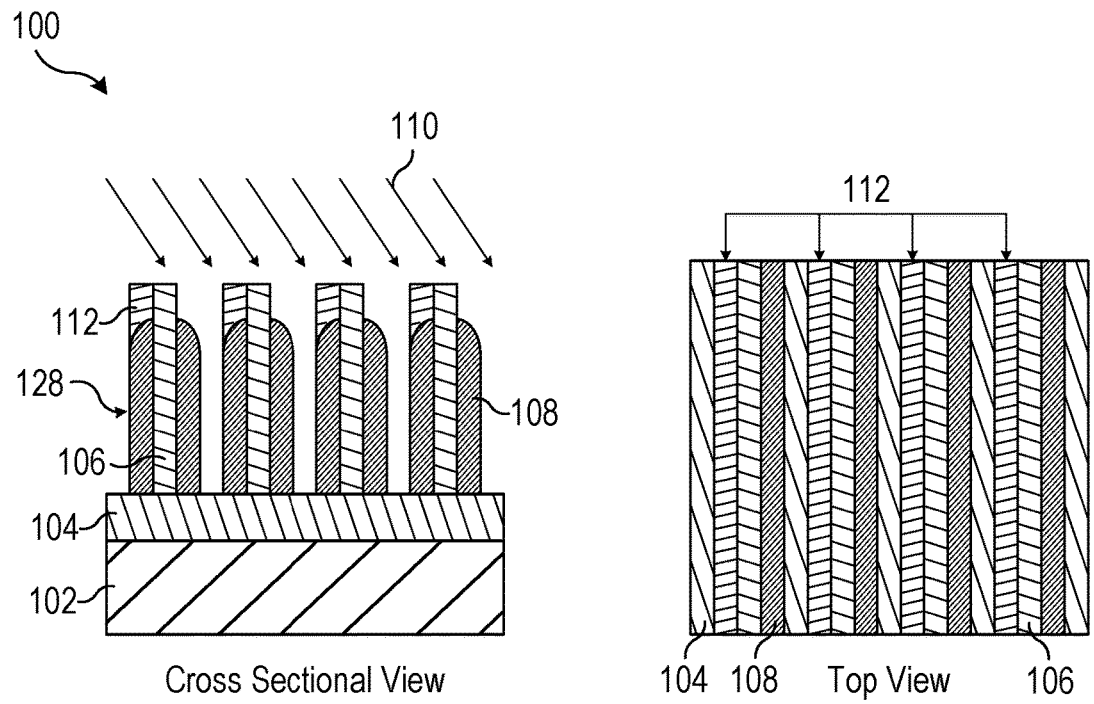
Figure 1D:
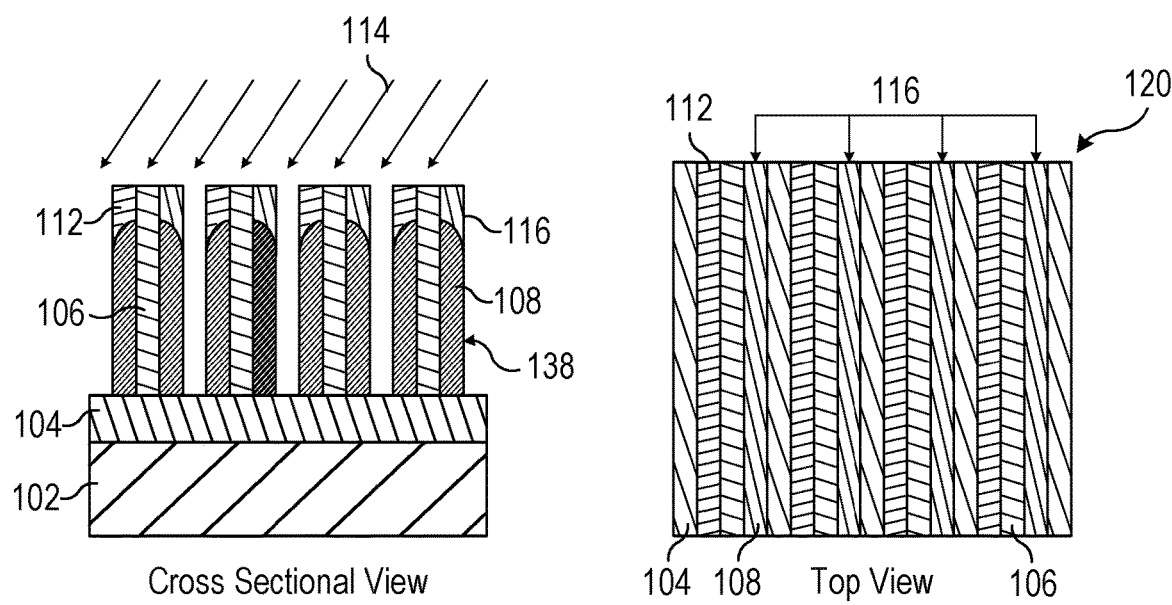
Figure 1E:
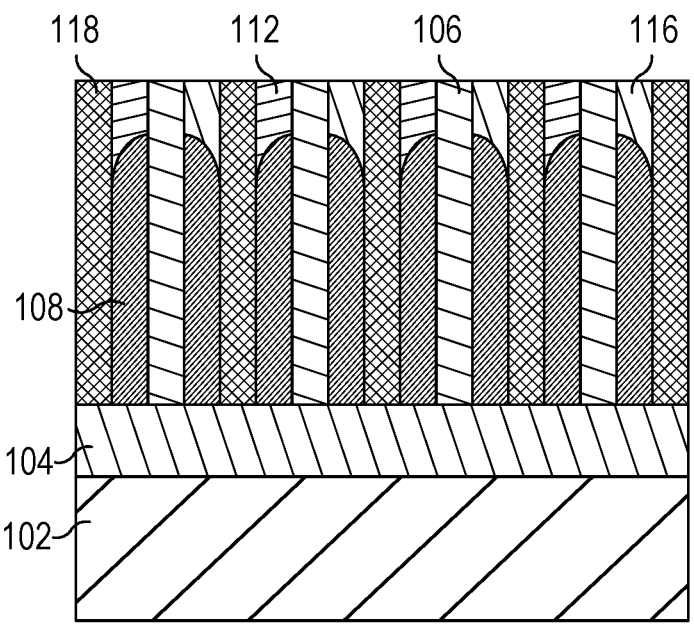
Figure 1E:
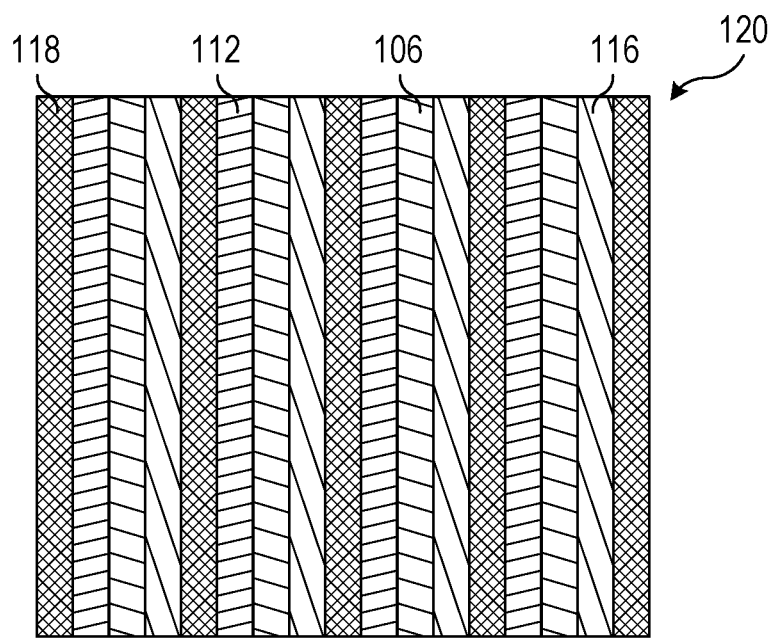

FIGS. 1A-1E illustrate an example process of patterning a substrate in accordance with an embodiment of the invention. FIG. 1A shows a conformal spacer material deposited over mandrels positioned on an underlying layer. FIG. 1B shows the mandrels after etching of the conformal spacer material. FIG. 1C shows a first capping material formed on a first side of the mandrels using an oblique angle deposition. FIG. 1D shows a second capping material formed on a second side of the mandrels using an oblique angle deposition. FIG. 1E shows a filler material formed in spaces between adjacent sidewall spacers.

Referring to FIG. 1A, a process 100 includes a substrate 102 including a plurality of mandrels 106. The mandrels may be positioned on an underlying layer 104 as shown. In one embodiment, the mandrels 106 comprise silicon. In another embodiment, the mandrels 106 comprise carbon. The underlying layer 104 comprises a semiconductor material in some embodiments, but may also be other materials. Alternatively, the underlying layer 104 may be omitted. Additional layers may also be included, but are not shown for clarity.

It should be noted that here and in the following a convention has been adopted for brevity and clarity wherein elements adhering to the pattern x02 may be related implementations of a substrate in various embodiments. An analogous convention has also been adopted for other elements as made clear by the use of similar terms in conjunction with the aforementioned three-digit numbering system.

A conformal spacer material 108 is deposited over the mandrels 106 and the underlying layer 104 as shown. The conformal spacer material may be deposited in any suitable manner such as by atomic layer deposition (ALD) or chemical vapor deposition (CVD), as examples. In one embodiment, the conformal spacer material 108 comprises SiN. In another embodiment, the conformal spacer material 108 comprises SiO2.

Referring to FIG. 1B, the conformal spacer material 108 is etched (e.g. by anisotropic etching). This removes conformal spacer material 108 from tops of the mandrels 106 as well as from the underlying layer 104 between the mandrels 106. The remaining sections of conformal spacer material 108 form spacers on sides of the mandrels 106. In particular, first sidewall spacers 128 are formed on first sidewalls 126 of the mandrels 106 while second sidewall spacers 138 are formed on second sidewalls 136. The first sidewall spacers 128 and the second sidewall spacers 138 have a lesser height compared to the mandrels 106 as shown. The deposition itself may result in some corner rounding. The spacer open etch can also contribute to rounding.

Referring to FIG. 1C, a first capping material 112 is deposited on top surfaces of the first sidewall spacers 128 using a first oblique angle deposition 110. In one embodiment, the first capping material 112 comprises silicon. In another embodiment, the first capping material 112 comprises carbon. In some embodiments, the first capping material 112 comprises a metal. For example, the first capping material 112 may be an oxide, a nitride, or an oxynitride. In various embodiments, the first capping material 112 is selected from a group consisting of SiO, SiN, SiON, Sn, SnO, Ti, TiO, TiN, Ta, TaN, Al, AlO, Zr, ZrO, Hf, HfO, W, and WC. However, other suitable materials may be apparent to those of skill in the art.

The first capping material 112 is deposited on only one side (first sidewalls 126 shown in FIG. 1B) of the mandrels 106. For example, the first oblique angle deposition 110 may be an oblique angle physical vapor deposition (PVD) sputter. One or more of the sputter target or the substrate 102 may be angled relative to the sputter source.

Referring to FIG. 1D, a second capping material 116 is deposited on top surfaces of the second sidewall spacers 138 using a second oblique angle deposition 114. Similar to the first capping material 112, the second capping material 116 is deposited on only one side (second sidewalls 136 shown in FIG. 1B) of the mandrels 106. Materials suitable for the second capping material 116 may be similar to the materials describe in reference to the first capping material 112. The second capping material 116 is chosen to be a different material than the first capping material 112 in implementations of the invention so that the first capping material 112 and the second capping material 116 advantageously have different etch resistivities (different colors).

The second oblique angle deposition 114 may also be an oblique angle PVD sputter. Other suitable oblique angle deposition techniques may also be used. The height of the mandrels 106 above the first sidewall spacers 128 and the second sidewall spacers 138 may advantageously facilitate deposition only on one side of the mandrels 106 by shadowing the far side of each mandrel during deposition.

At this juncture, a multiline layer 120 has been formed that includes the mandrels 106, the first capping material 112, and the second capping material 116.

Now referring to FIG. 1E, a filler material 118 may optionally be used to fill spaces between adjacent sidewall spacers. For example, the filler material 118 can be an overcoat fill (e.g. spin-on material) or a CVD deposited film. After formation, the filler material 118 may be removed down to a top surface of the multiline layer 120, such as by a non-selective dry etch back process or by chemical-mechanical polishing (CMP).

The result is the multiline layer 120 that now includes the mandrels 106, the first capping material 112, the second capping material 116, and the filler material 118. The multiline layer 120 may advantageously include with four different uncovered materials. Depending on materials selected, one or more materials can be etched without etching the remaining materials (e.g. due to differences in etching chemistry).

With the multiline layer 120 formed, various patterning steps can be continued. For example, etch masks (e.g. a patterned mask layer) may be used to uncover certain areas or slots on the multiline layer 120, and then a selective etch may be beneficially used to etch one or more specific materials (colors) with high selectivity. Accordingly, a desired pattern is transferred into any underlying layers, memory layers, hardmasks, etc. FIGS. 3, 4, 5A, and 5B provide various examples of pattern transfer to underlying layers using a multiline layer. In some embodiments, the critical dimension of the pattern transferred to the underlying layer 104 is less than about 20 nm.

Figure 2:
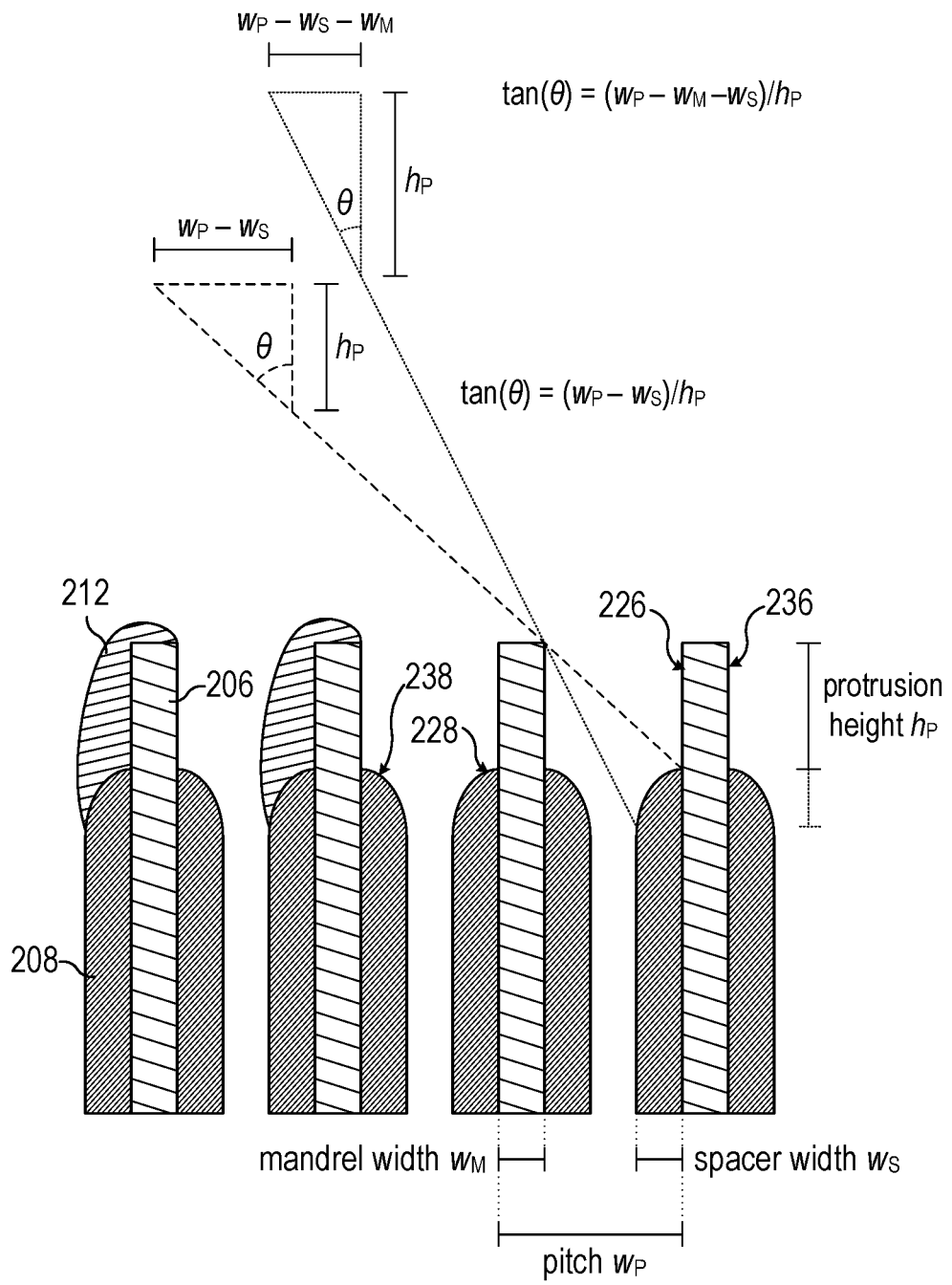
FIG. 2 illustrates a schematic drawing of an oblique angle deposition of a capping material in accordance with an embodiment of the invention.

FIG. 2 illustrates a schematic drawing of an oblique angle deposition of a capping material in accordance with an embodiment of the invention. The capping material of FIG. 2 may be a representation of other capping materials described herein such as the first capping material 112 or the second capping material 116 of FIGS. 1A-1E, for example. Similarly labeled elements may be as previous described.

Referring to FIG. 2, mandrels 206 with corresponding first sidewall spacers 228 abutting first sidewalls 226 and second sidewall spacers 238 abutting second sidewalls 236 are shown. The first sidewall spacers 228 and the second sidewall spacers 238 may be formed from a conformal spacer material 208.

During an oblique angle deposition (e.g. PVD) process, a capping material 212 is deposited from one side. The angle of deposition may depend on several physical parameters of the mandrels 206, the first sidewall spacers 228, and the second sidewall spacers 238. For example, the mandrels 206 may have an average mandrel width wM, the sidewall spacers may have an average spacer width wS, and the mandrels 206 may be spaced apart from one another by a pitch wP.

Meanwhile, the mandrels 206 protrude about the sidewall spacers at a protrusion height hP which may be defined as a range due to the rounded corners of the conformal spacer material 208. The rounding may be more or less pronounced in various embodiments. In some cases an average value may be selected for the protrusion height hP. A person of skill in art will recognize that the measurement designations of FIG. 2 are but one way to assign values to parameters of the mandrels and sidewall spacers to illustrate the relationship between the deposition angle and various distances.

As shown, a range of angles (measured from a normal vector of the substrate surface) can be calculated from the given variables:

$$\tan\theta = \frac{w_P - w_M - w_S}{h_P} \quad (1)$$

$$\tan\theta = \frac{w_P - w_S}{h_P} \quad (2)$$

It should be noted that more or less capping material 212 can be deposited on top of the mandrel depending on a particular sputtering angle used. The process may then be repeated with oblique angle deposition from the other side. Although the range of deposition angles defined above may be desirable, other angles can also be used. For example, a larger angle than in Equation (2) may also be used.

As can be appreciated, techniques herein can be used for line patterning, trench patterning, contact hole patterning, and so forth. FIGS. 3, 4, 5A, and 5B provide various examples of pattern transfer to underlying layers using a multiline layer.

Figure 3:
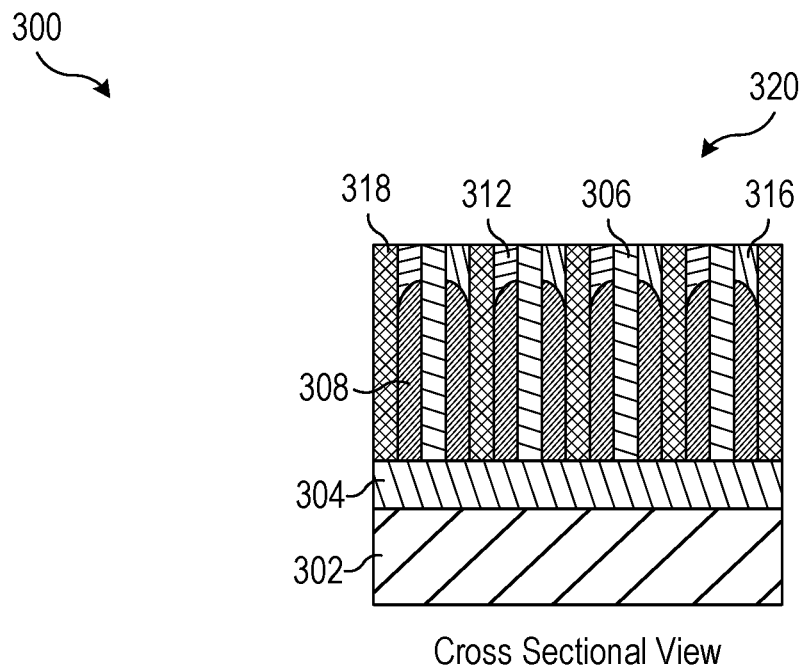
FIG. 3 illustrates an example process of patterning an underlying layer in accordance with an embodiment of the invention.
Figure 3:
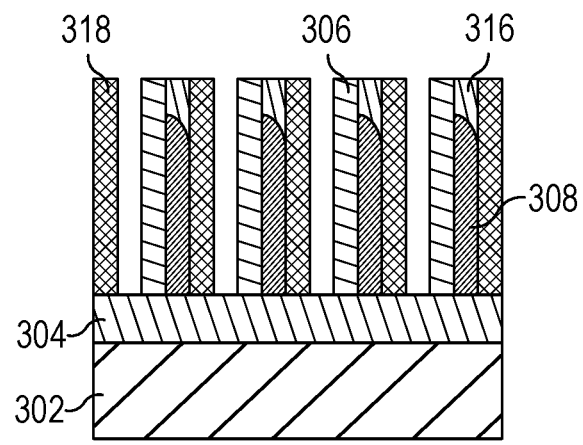
Figure 3:
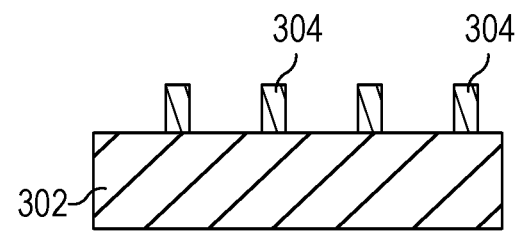

FIG. 3 illustrates an example process of patterning an underlying layer in accordance with an embodiment of the invention. The process of FIG. 3 may be a specific implementation of or an extension of other processes described herein, such as the process of FIGS. 1A-1E, for example. Similarly labeled elements may be as previous described.

Referring to FIG. 3, a process 300 includes a multiline layer 320 including four exposed materials: mandrels 306, a first capping material 312, a second capping material 316, and a filler material 318. The multiline layer 320 is disposed on a substrate 302 and may be positioned over an underlying layer 304. As previously described each of the aforementioned materials may have etch electivity relative to the other materials. The process 300 illustrates a spacer-defined line patterning flow.

With four different materials in the multiline layer 320 that are independently selectable using appropriate etching chemistries, any combination of lines can be removed for transfer to an underlying layer 304. For line patterning, three lines can be removed. For example, the first capping material 312 may be selectively removed and then the mandrels 306 and the filler material 318 may also be removed as shown.

In one embodiment, the first capping material 312 is selectively removed and the mandrels 306, the conformal spacer material 308, and the filler material 318 may be anisotropically etched away using chemistry that does not appreciable etch the second capping material 316. In this way, the second capping material 316 may advantageously be used as a mask to protect the conformal spacer material 308. The mandrels 306 and the filler material 318 may also be selectively removed individually.

The remaining line of the multiline layer 320 that includes the second capping material 316 is then used as an etch mask. An additional mask (such as a patterned mask layer) may also be included to form additional structures in the underlying layer 304 (e.g. gates, fins, contacts, etc.). In various embodiments, etching chemistry is used that does not appreciably etch the second capping material 316, but that does etch the underlying layer 304.

In one embodiment, etching chemistry is used that does not appreciably etch the second capping material 316, but that does etch the underlying layer 304, the mandrels 306, the conformal spacer material 308, and the filler material 318. The etching chemistry may also not etch the substrate 302 (e.g. used as an etch stop).

One or more etch masks formed above the multiline layer 320 can further define a given pattern to be transferred to the underlying layer 304. In some embodiments, the critical dimension of the pattern transferred to the underlying layer 304 is less than about 20 nm.

Figure 4:
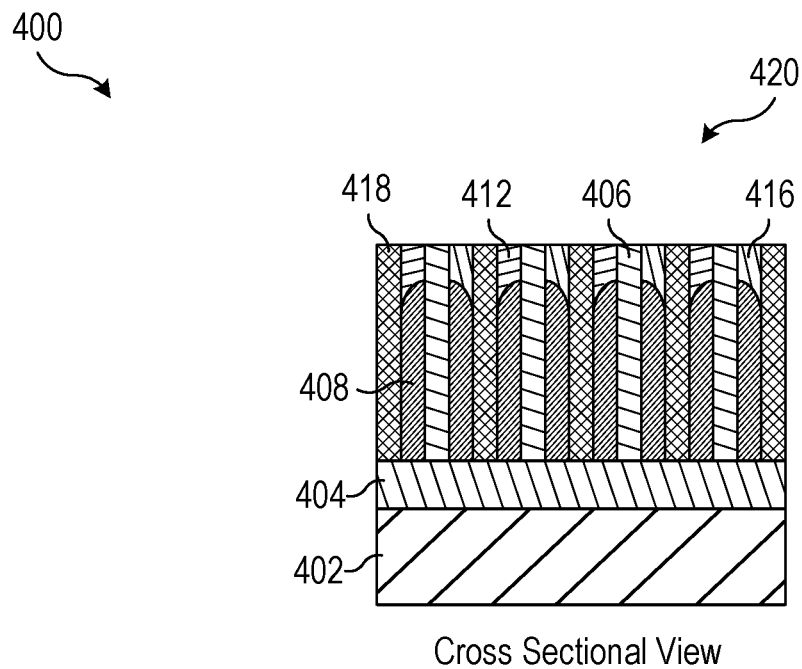
FIG. 4 illustrates another example process of patterning an underlying layer in accordance with an embodiment of the invention.
Figure 4:
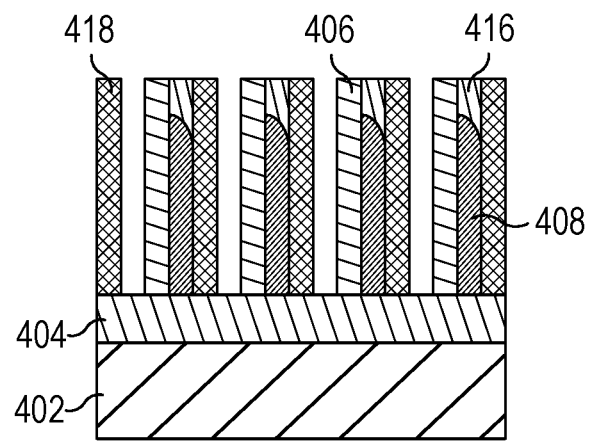
Figure 4:
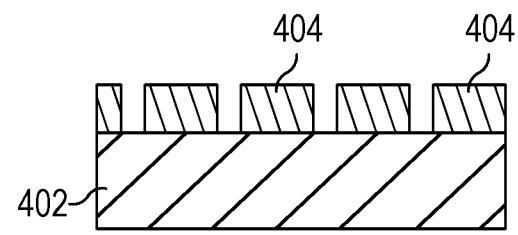

FIG. 4 illustrates another example process of patterning an underlying layer in accordance with an embodiment of the invention. The process of FIG. 4 may be a specific implementation of or an extension of other processes described herein, such as the process of FIGS. 1A-1E, for example. Similarly labeled elements may be as previous described.

Referring to FIG. 4, a process 400 includes a multiline layer 420 including four exposed materials: mandrels 406, a first capping material 412, a second capping material 416, and a filler material 418. The multiline layer 420 is disposed on a substrate 402 and may be positioned over an underlying layer 404. In contrast to the process 300, the process 400 illustrates a spacer-define trench patterning flow.

For trench patterning, a single line can be removed. For example, the first capping material 412 may be selectively removed. The remaining three lines of the multiline layer 420 that includes the mandrels 406, the second capping material 416, and the filler material 418 may then be used as an etch mask. An additional mask (such as a patterned mask layer) may also be included to form additional structures in the underlying layer 404 (e.g. gates, fins, contacts, etc.). In various embodiments, etching chemistry is used that does not appreciably etch the mandrels 406, the second capping material 416, and the filler material 418, but that does etch the underlying layer 404.

In one embodiment, etching chemistry is used that does not appreciably etch the mandrels 406, the second capping material 416, and the filler material 418, but that does etch the underlying layer 304 and the conformal spacer material 408. The etching chemistry may also not etch the substrate 302 (e.g. used as an etch stop).

As before, one or more etch masks formed above the multiline layer 420 can further define a given pattern to be transferred to the underlying layer 404. In some embodiments, the critical dimension of the pattern transferred to the underlying layer 404 is less than about 20 nm.

Figure 5A:
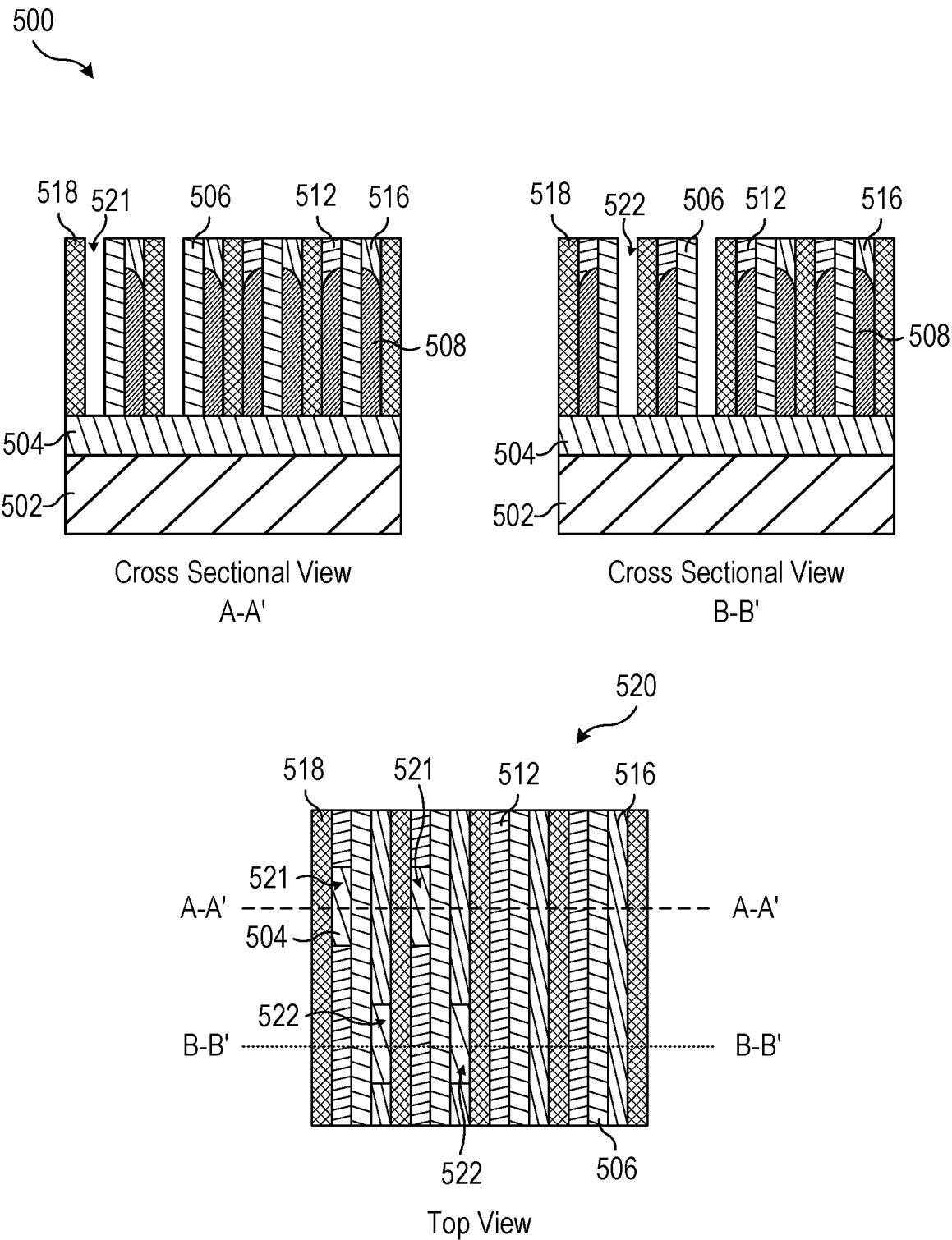
FIGS. 5A and 5B illustrate still another example process of patterning an underlying layer in accordance with an embodiment of the invention, where
Figure 5B:
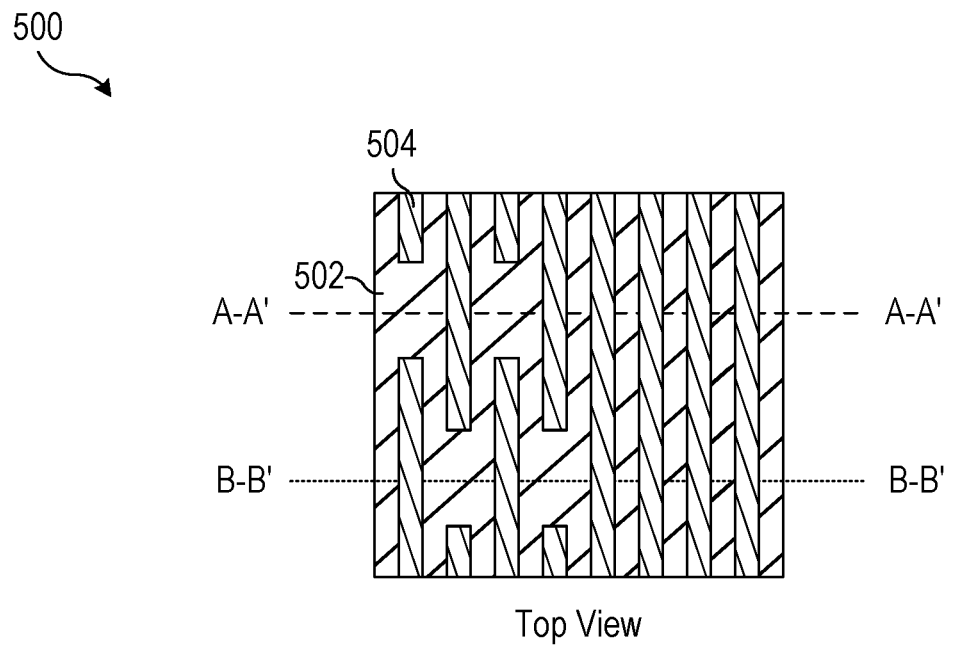
Figure 5B:
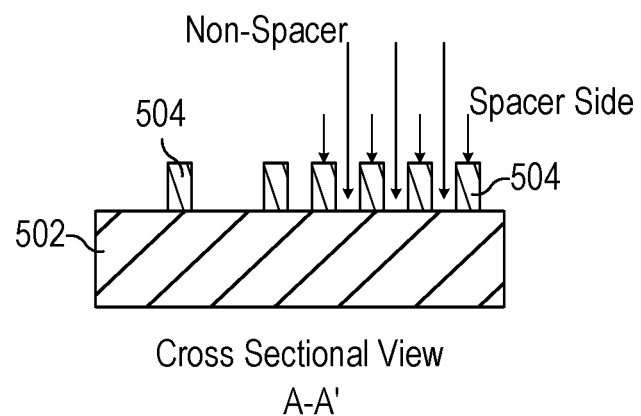
Figure 5B:
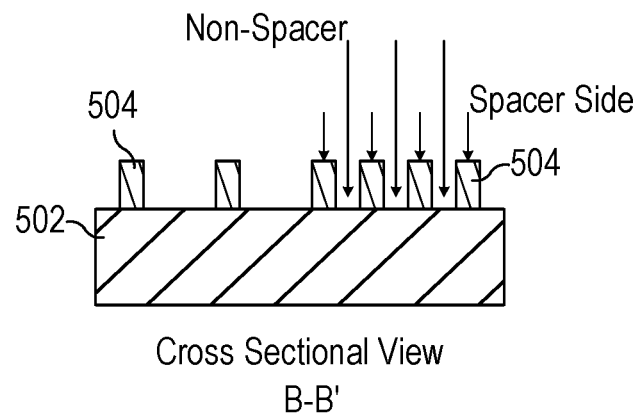

FIGS. 5A and 5B illustrate still another example process of patterning an underlying layer in accordance with an embodiment of the invention. FIG. 5A shows cuts made in a multiline pattern. FIG. 5B shows the resulting pattern transferred to the underlying layer. The process of FIGS. 5A and 5B may be a specific implementation of or an extension of other processes described herein, such as the process of FIGS. 1A-1E, for example. Similarly labeled elements may be as previous described.

Referring to FIG. 5A, one or more additional masks (e.g. defined using photolithography) may be used over a multiline layer 520 to form first cuts 521 in lines containing the first capping material 512 and second cuts 522 in lines containing the second capping material 516. Cuts can also be made in lines containing the mandrels 506 and/or the filler material 518 (e.g. fin breaks can be placed at any desired location with self-alignment by virtue of etch resistivities). In some cases it may be beneficial to make cuts in the spacer lines (first capping material 512 and second capping material 516 as shown) to utilize the improved uniformity of the spacer width.

As shown, the first cuts 521 and the second cuts 522 expose the underlying layer 504 disposed on the substrate 502. In some cases the resolution of the additional masks used to make the first cuts 521 and the second cuts 522 is greater than the line width of the multiline layer 520. In various embodiments, the critical dimension of the patterned mask layer used to define the first cuts is greater than double the critical dimension of the pattern transferred to the underlying layer by the multiline layer 520. In some embodiments, the critical dimension of the patterned mask layer used to define the first cuts is greater than quadruple the critical dimension of the pattern transferred to the underlying layer by the multiline layer 520. In one embodiment, the critical dimension of the patterned mask layer used to define the first cuts is about four times the critical dimension of the pattern transferred to the underlying layer by the multiline layer 520. In some embodiments, the critical dimension of the pattern transferred to the underlying layer 504 is less than about 20 nm.

Referring now to FIG. 5B, the pattern of the multiline layer 520 including the first cuts 521 and the second cuts 522 is transferred to the underlying layer 504 as shown. The features in this example advantageously have the width of the sidewall spacers made from the conformal spacer material 508. The multiline layer 520 and other embodiment multiline layers described herein, may afford one or more of the benefits of increased line uniformity, decreased line width, and increased line density over conventional techniques.

Figure 6:
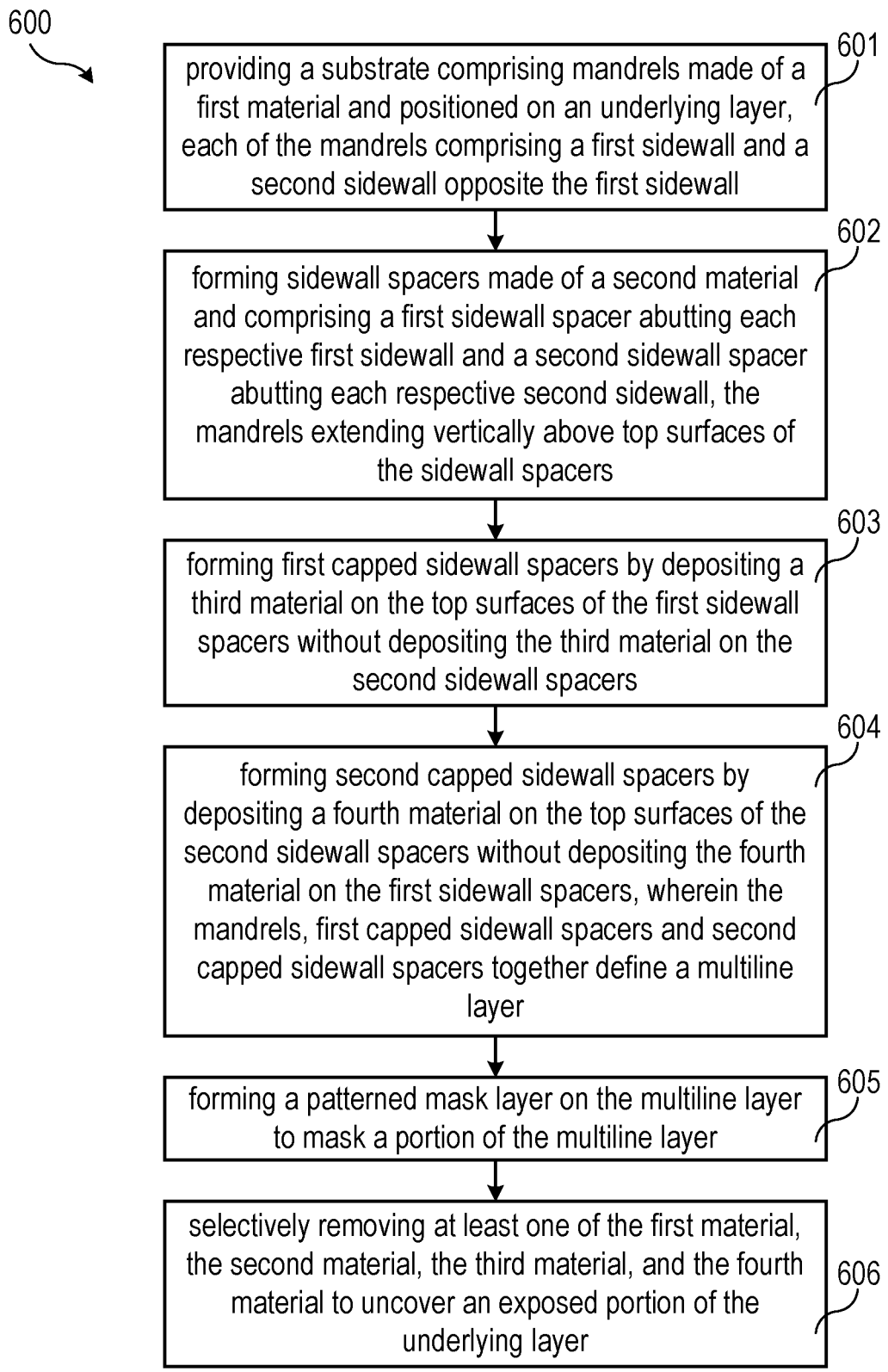
FIG. 6 illustrates an example method of patterning a substrate in accordance with an embodiment of the invention.

FIG. 6 illustrates an example method of patterning a substrate in accordance with an embodiment of the invention. The method of FIG. 6 may be performed using embodiment processes as described herein. For example, the method of FIG. 6 may be combined with any of the embodiments of FIGS. 1A-1E, 2-4, 5A, and 5B. The below method steps may be performed in any suitable order as may be apparent to a person of skill in the art.

Referring to FIG. 6, step 601 of a method 600 is providing a substrate including mandrels made of a first material and positioned on an underlying layer. Each of the mandrels includes a first sidewall and a second sidewall opposite the first sidewall. Step 602 includes forming sidewall spacers made of a second material and including a first sidewall spacer abutting each respective first sidewall and a second sidewall spacer abutting each respective second sidewall. The mandrels extend vertically above top surfaces of the sidewall spacers.

Step 603 includes forming first capped sidewall spacers by depositing a third material on the top surfaces of the first sidewall spacers without depositing the third material on the second sidewall spacers. Second sidewall capped spacers are formed by depositing a fourth material on the top surfaces of the second sidewall spacers without depositing the fourth material on the first sidewall spacers in step 604. The mandrels, first capped sidewall spacers and second capped sidewall spacers together define a multiline layer.

The method 600 further includes forming a patterned mask layer on the multiline layer to mask a portion of the multiline layer in step 605. Step 606 is to selectively remove at least one of the first material, the second material, the third material, and the fourth material to uncover an exposed portion of the underlying layer.

Figure 7:
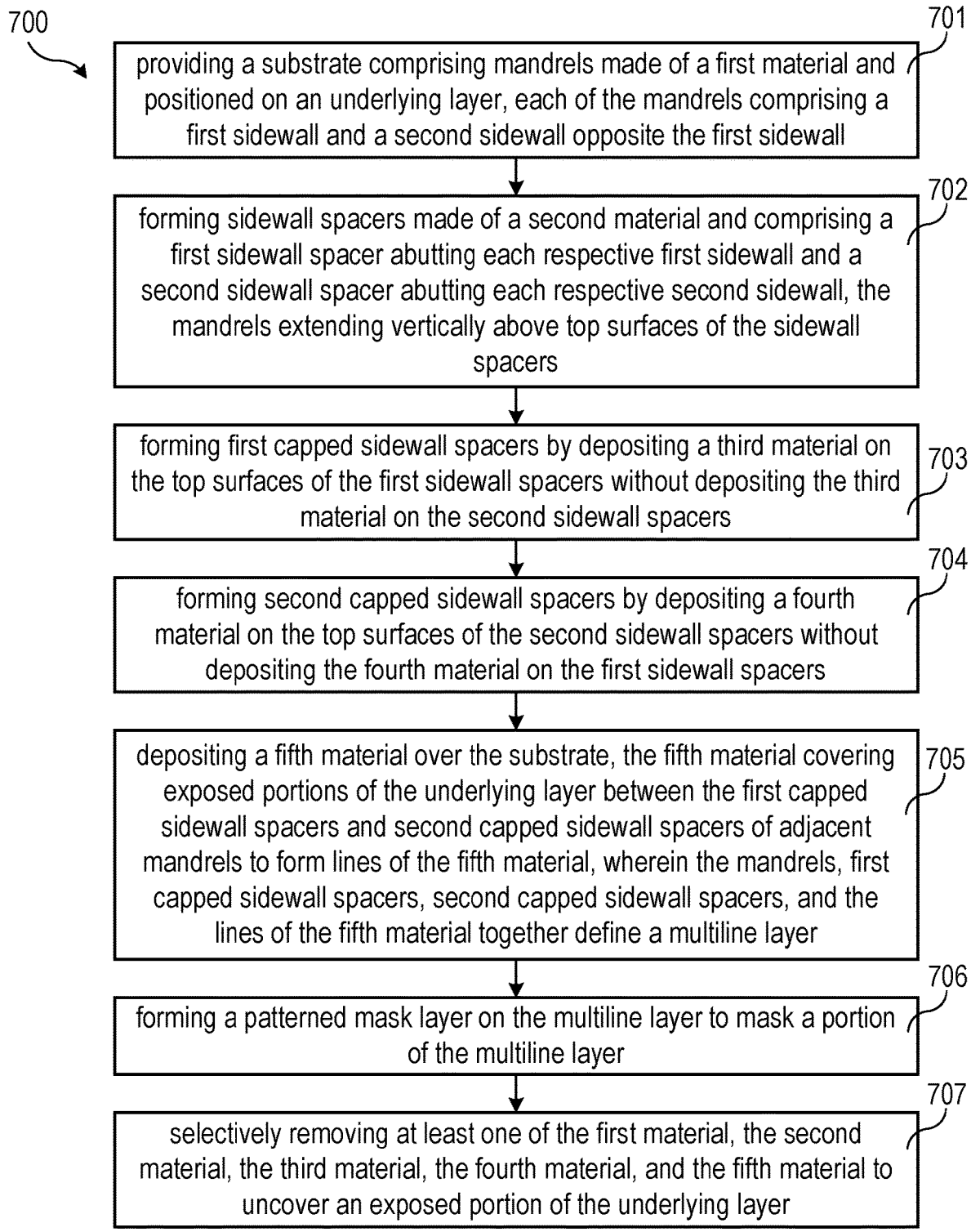
FIG. 7 illustrates another example method of patterning a substrate in accordance with an embodiment of the invention.

FIG. 7 illustrates another example method of patterning a substrate in accordance with an embodiment of the invention. The method of FIG. 7 may be performed using embodiment processes as described herein. For example, the method of FIG. 7 may be combined with any of the embodiments of FIGS. 1A-1E, 2-4, 5A, and 5B. Further the method of FIG. 7 may also be combined with the method of FIG. 6. The below method steps may be performed in any suitable order as may be apparent to a person of skill in the art.

Referring to FIG. 7, step 701 of a method 700 is providing a substrate including mandrels made of a first material and positioned on an underlying layer. Each of the mandrels includes a first sidewall and a second sidewall opposite the first sidewall. Step 702 includes forming sidewall spacers made of a second material and including a first sidewall spacer abutting each respective first sidewall and a second sidewall spacer abutting each respective second sidewall. The mandrels extend vertically above top surfaces of the sidewall spacers.

Step 703 includes forming first capped sidewall spacers by depositing a third material on the top surfaces of the first sidewall spacers without depositing the third material on the second sidewall spacers. Second capped sidewall spacers are formed by depositing a fourth material on the top surfaces of the second sidewall spacers without depositing the fourth material on the first sidewall spacers in step 704.

Step 705 of the method 700 includes depositing a fifth material over the substrate. The fifth material covers exposed portions of the underlying layer between the first capped sidewall spacers and second capped sidewall spacers of adjacent mandrels to form lines of the fifth material. The mandrels, first capped sidewall spacers, second capped sidewall spacers, and the lines of the fifth material together define a multiline layer.

Step 706 is to form a patterned mask layer on the multiline layer to mask a portion of the multiline layer. In step 707, at least one of the first material, the second material, the third material, the fourth material, and the fifth material is selectively removed to uncover an exposed portion of the underlying layer.

Figure 8:
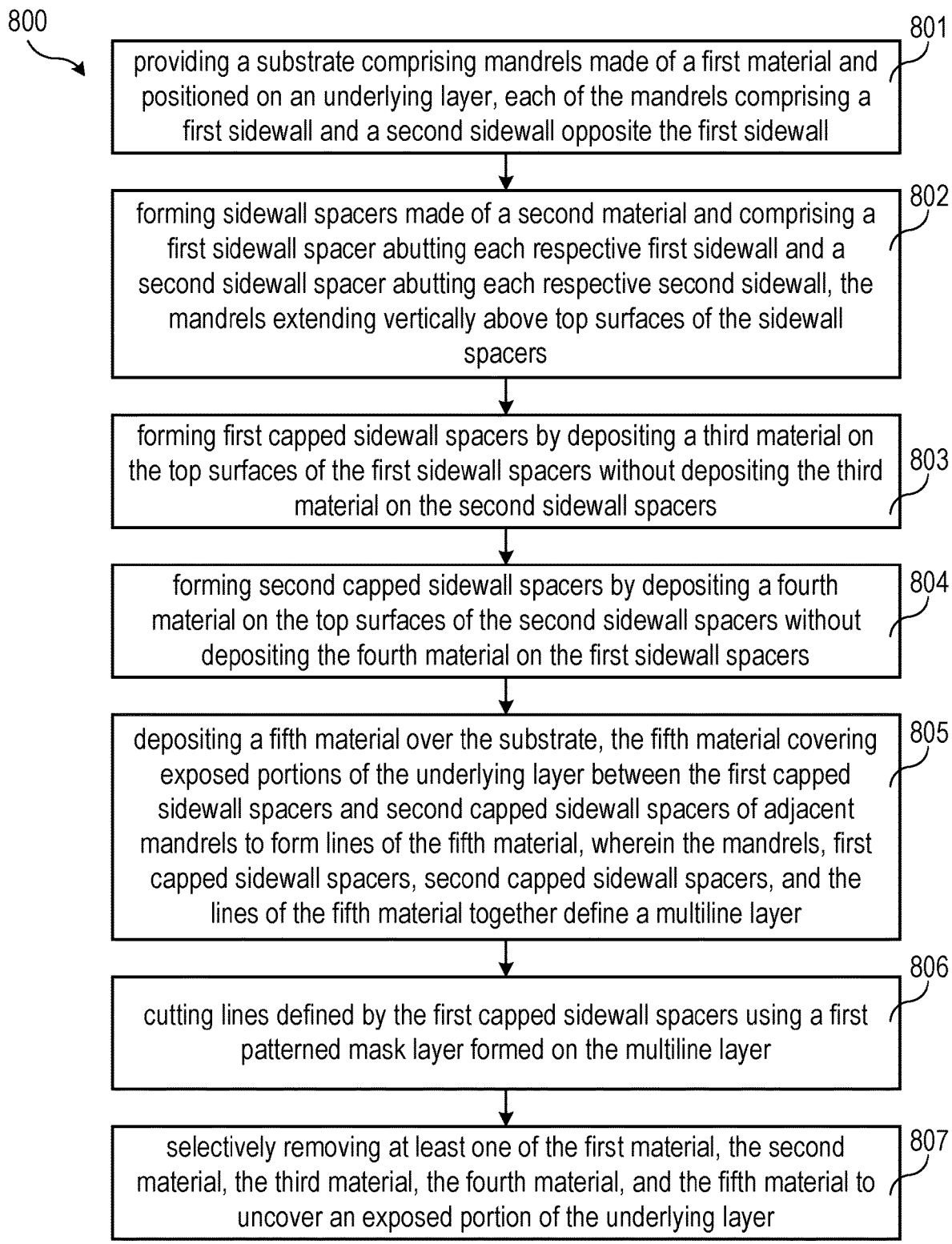
FIG. 8 illustrates still another example method of patterning a substrate in accordance with an embodiment of the invention.

FIG. 8 illustrates still another example method of patterning a substrate in accordance with an embodiment of the invention. The method of FIG. 8 may be performed using embodiment processes as described herein. For example, the method of FIG. 8 may be combined with any of the embodiments of FIGS. 1A-1E, 2-4, 5A, and 5B. Further the method of FIG. 8 may also be combined with on or both of the methods of FIGS. 6 and 7. The below method steps may be performed in any suitable order as may be apparent to a person of skill in the art.

Referring to FIG. 8, step 801 of a method 800 is providing a substrate including mandrels made of a first material and positioned on an underlying layer. Each of the mandrels including a first sidewall and a second sidewall opposite the first sidewall. Step 802 includes forming sidewall spacers made of a second material and including a first sidewall spacer abutting each respective first sidewall and a second sidewall spacer abutting each respective second sidewall. The mandrels extend vertically above top surfaces of the sidewall spacers.

Step 803 includes forming first capped sidewall spacers by depositing a third material on the top surfaces of the first sidewall spacers without depositing the third material on the second sidewall spacers. Second capped sidewall spacers are formed by depositing a fourth material on the top surfaces of the second sidewall spacers without depositing the fourth material on the first sidewall spacers in step 804.

Step 805 of the method 800 includes depositing a fifth material over the substrate. The fifth material covers exposed portions of the underlying layer between the first capped sidewall spacers and second capped sidewall spacers of adjacent mandrels to form lines of the fifth material. The mandrels, first capped sidewall spacers, second capped sidewall spacers, and the lines of the fifth material together define a multiline layer.

Lines defined by the first capped sidewall spacers are cut using a first patterned mask layer formed on the multiline layer in step 806. Step 807 includes selectively removing at least one of the first material, the second material, the third material, the fourth material, and the fifth material to uncover an exposed portion of the underlying layer.

Techniques herein release lithography overlay concerns, and also address edge placement error challenges. Multi-line layers can be formed herein with at least four colors or materials. And then selective material etching further narrows a given slot opening, contact opening, or other etch mask pattern. An ALD line can be used to transfer a final line to minimize line CD variation. A single line pull can be executed with relaxed block lithography. Techniques herein can be used for cutting memory fins (of FinFETs). Thus, any type of block mask or keep mask can be used with the multi-line layer herein for further, self-aligned patterning.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Example embodiments of the invention are summarized here. Other embodiments can also be understood from the entirety of the specification as well as the claims filed herein.

Example 1. A method of patterning a substrate, the method including: providing a substrate including mandrels made of a first material and positioned on an underlying layer, each of the mandrels including a first sidewall and a second sidewall opposite the first sidewall; forming sidewall spacers made of a second material and including a first sidewall spacer abutting each respective first sidewall and a second sidewall spacer abutting each respective second sidewall, the mandrels extending vertically above top surfaces of the sidewall spacers; forming first capped sidewall spacers by depositing a third material on the top surfaces of the first sidewall spacers without depositing the third material on the second sidewall spacers; forming second capped sidewall spacers by depositing a fourth material on the top surfaces of the second sidewall spacers without depositing the fourth material on the first sidewall spacers, where the mandrels, first capped sidewall spacers and second capped sidewall spacers together define a multiline layer; forming a patterned mask layer on the multiline layer to mask a portion of the multiline layer; and selectively removing at least one of the first material, the second material, the third material, and the fourth material to uncover an exposed portion of the underlying layer.

Example 2. The method of example 1, where the third material is deposited via angled physical vapor deposition (PVD) angled sputtering.

Example 3. The method of one of examples 1 to 2, where a selected deposition angle, a selected deposition direction, and a selected average mandrel height measured from the top surfaces of the sidewall spacers prevent deposition on the top surfaces of the second sidewall spacers when depositing on the first sidewall spacers and prevent deposition on the top surfaces of the first sidewall spacers when depositing on the top surfaces of the first sidewall spacers.

Example 4. The method of example 3, where the tangent of the selected deposition angle is greater than a ratio, the ratio being equal to the sum of the average spacer width and the average mandrel width subtracted from the mandrel pitch and then divided by the selected average mandrel height.

Example 5. The method of one of examples 1 to 4, further including transferring a pattern defined by the exposed portion to the underlying layer.

Example 6. The method of example 5, where the pattern defined by the exposed portion that is transferred to the underlying layer includes a critical dimension less than about 20 nm.

Example 7. The method of one of examples 1 to 6, where selectively removing includes selectively removing at least three materials chosen from the group consisting of: the first material, the second material, the third material, and the fourth material from the multiline layer, and transferring a pattern defined by a remaining line into the underlying layer.

Example 8. The method of example 7, where the pattern defined by the remaining line that is transferred to the underlying layer includes a critical dimension less than about 20 nm.

Example 9. The method of one of examples 1 to 8, further including: depositing a fifth material over the mandrels, the first capped sidewall spacers, and the second capped sidewall spacers; where the multiline layer includes openings between groupings of features, each grouping of features including one mandrel, one first capped sidewall spacer, and one second capped sidewall spacer; and where the fifth material fills the openings in the multiline layer and defines additional lines in the multiline layer.

Example 10. A method of patterning a substrate, the method including: providing a substrate including mandrels made of a first material and positioned on an underlying layer, each of the mandrels including a first sidewall and a second sidewall opposite the first sidewall; forming sidewall spacers made of a second material and including a first sidewall spacer abutting each respective first sidewall and a second sidewall spacer abutting each respective second sidewall, the mandrels extending vertically above top surfaces of the sidewall spacers; forming first capped sidewall spacers by depositing a third material on the top surfaces of the first sidewall spacers without depositing the third material on the second sidewall spacers; forming second capped sidewall spacers by depositing a fourth material on the top surfaces of the second sidewall spacers without depositing the fourth material on the first sidewall spacers; depositing a fifth material over the substrate, the fifth material covering exposed portions of the underlying layer between the first capped sidewall spacers and second capped sidewall spacers of adjacent mandrels to form lines of the fifth material, where the mandrels, first capped sidewall spacers, second capped sidewall spacers, and the lines of the fifth material together define a multiline layer; forming a patterned mask layer on the multiline layer to mask a portion of the multiline layer; and selectively removing at least one of the first material, the second material, the third material, the fourth material, and the fifth material to uncover an exposed portion of the underlying layer.

Example 11. The method of example 10, further including transferring a pattern defined by the exposed portion to the underlying layer.

Example 12. The method of example 11, where selectively removing includes: selectively removing the third material to exposed the first sidewall spacers; removing the first sidewall spacers; and where the exposed portion is the area of the underlying layer that was previously covered by the first sidewall spacer.

Example 13. The method of example 11, where the pattern defined by the exposed portion that is transferred to the underlying layer includes a critical dimension less than about 20 nm.

Example 14. The method of one of examples 10 to 13, where selectively removing includes selectively removing at least three materials chosen from the group consisting of: the first material, the second material, the third material, the fourth material, and the fifth material from the multiline layer, and transferring a pattern defined by a remaining line into the underlying layer.

Example 15. The method of example 14, where the pattern defined by the remaining line that is transferred to the underlying layer includes a critical dimension less than about 20 nm.

Example 16. A method of patterning a substrate, the method including: providing a substrate including mandrels made of a first material and positioned on an underlying layer, each of the mandrels including a first sidewall and a second sidewall opposite the first sidewall; forming sidewall spacers made of a second material and including a first sidewall spacer abutting each respective first sidewall and a second sidewall spacer abutting each respective second sidewall, the mandrels extending vertically above top surfaces of the sidewall spacers; forming first capped sidewall spacers by depositing a third material on the top surfaces of the first sidewall spacers without depositing the third material on the second sidewall spacers; forming second capped sidewall spacers by depositing a fourth material on the top surfaces of the second sidewall spacers without depositing the fourth material on the first sidewall spacers; depositing a fifth material over the substrate, the fifth material covering exposed portions of the underlying layer between the first capped sidewall spacers and second capped sidewall spacers of adjacent mandrels to form lines of the fifth material, where the mandrels, first capped sidewall spacers, second capped sidewall spacers, and the lines of the fifth material together define a multiline layer; cutting lines defined by the first capped sidewall spacers using a first patterned mask layer formed on the multiline layer; and selectively removing at least one of the first material, the second material, the third material, the fourth material, and the fifth material to uncover an exposed portion of the underlying layer.

Example 17. The method of example 16, further including: cutting lines defined by the second capped sidewall spacers using a second patterned mask layer formed on the multiline layer.

Example 18. The method of one of examples 16 and 17, further including: transferring a pattern defined by the exposed portion of the underlying layer; where the pattern defined by the exposed portion that is transferred to the underlying layer includes a first critical dimension less than about 20 nm; and where the first patterned mask layer includes a second critical dimension about four times the first critical dimension.

Example 19. The method of example 18, where selectively removing includes: selectively removing the first material and the fifth material from the multiline layer; and the pattern defined by the exposed portion that is transferred to the underlying layer includes fins of a FinFET, each fin having a width less than about 20 nm.

Example 20. The method of one of examples 16 to 19, where selectively removing includes: selectively removing at least three materials chosen from the group consisting of: the first material, the second material, the third material, the fourth material, and the fifth material from the multiline layer, and transferring a pattern defined by a remaining line into the underlying layer; where the pattern defined by the exposed portion that is transferred to the underlying layer includes a first critical dimension less than about 20 nm; and where the first patterned mask layer includes a second critical dimension about four times the first critical dimension.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of patterning a substrate, the method comprising:

providing a substrate comprising mandrels made of a first material and positioned on an underlying layer, each of the mandrels comprising a first sidewall and a second sidewall opposite the first sidewall;

forming sidewall spacers made of a second material and comprising a first sidewall spacer abutting each respective first sidewall and a second sidewall spacer abutting each respective second sidewall, the mandrels extending vertically above top surfaces of the sidewall spacers;

forming first capped sidewall spacers by depositing a third material on the top surfaces of the first sidewall spacers without depositing the third material on the second sidewall spacers;

forming second capped sidewall spacers by depositing a fourth material on the top surfaces of the second sidewall spacers without depositing the fourth material on the first sidewall spacers, the fourth material having a different etch resistivity than the third material, wherein the mandrels, first capped sidewall spacers and second capped sidewall spacers together define a multiline layer;

forming a patterned mask layer on the multiline layer to mask a portion of the multiline layer; and selectively removing at least one of the first material, the second material, the third material, and the fourth material to uncover an exposed portion of the underlying layer.

2. The method of claim 1, wherein the third material is deposited via angled physical vapor deposition (PVD) angled sputtering.

3. The method of claim 1, wherein a selected deposition angle, a selected deposition direction, and a selected average mandrel height measured from the top surfaces of the sidewall spacers prevent deposition on the top surfaces of the second sidewall spacers when depositing on the first sidewall spacers and prevent deposition on the top surfaces of the first sidewall spacers when depositing on the top surfaces of the first sidewall spacers.

4. The method of claim 3, wherein the tangent of the selected deposition angle is greater than a ratio, the ratio being equal to the sum of an average spacer width and an average mandrel width subtracted from a mandrel pitch and then divided by a selected average mandrel height.

5. The method of claim 1, further comprising transferring a pattern defined by the exposed portion to the underlying layer.

6. The method of claim 5, wherein the pattern defined by the exposed portion that is transferred to the underlying layer comprises a critical dimension less than about 20 nm.

7. The method of claim 1, wherein selectively removing comprises selectively removing at least three materials chosen from the group consisting of: the first material, the second material, the third material, and the fourth material from the multiline layer, and transferring a pattern defined by a remaining line into the underlying layer.

8. The method of claim 7, wherein the pattern defined by the remaining line that is transferred to the underlying layer comprises a critical dimension less than about 20 nm.

9. The method of claim 1, further comprising:
depositing a fifth material over the mandrels, the first capped sidewall spacers, and the second capped sidewall spacers;
wherein the multiline layer comprises openings between groupings of features, each grouping of features comprising one mandrel, one first capped sidewall spacer, and one second capped sidewall spacer; and
wherein the fifth material fills the openings in the multiline layer and defines additional lines in the multiline layer.

10. A method of patterning a substrate, the method comprising:
providing a substrate comprising mandrels made of a first material and positioned on an underlying layer, each of the mandrels comprising a first sidewall and a second sidewall opposite the first sidewall;

forming sidewall spacers made of a second material and comprising a first sidewall spacer abutting each respective first sidewall and a second sidewall spacer abutting each respective second sidewall, the mandrels extending vertically above top surfaces of the sidewall spacers;

forming first capped sidewall spacers by depositing a third material on the top surfaces of the first sidewall spacers without depositing the third material on the second sidewall spacers;

forming second capped sidewall spacers by depositing a fourth material on the top surfaces of the second sidewall spacers without depositing the fourth material on the first sidewall spacers, the fourth material having a different etch resistivity than the third material;

depositing a fifth material over the substrate, the fifth material covering exposed portions of the underlying layer between the first capped sidewall spacers and second capped sidewall spacers of adjacent mandrels to form lines of the fifth material, wherein the mandrels, first capped sidewall spacers, second capped sidewall spacers, and the lines of the fifth material together define a multiline layer;

forming a patterned mask layer on the multiline layer to mask a portion of the multiline layer; and selectively removing at least one of the first material, the second material, the third material, the fourth material, and the fifth material to uncover an exposed portion of the underlying layer.

11. The method of claim 10, further comprising transferring a pattern defined by the exposed portion of the underlying layer.

12. The method of claim 11, wherein selectively removing comprises:
selectively removing the third material to expose the first sidewall spacers;
removing the first sidewall spacers; and
wherein the exposed portion is an area of the underlying layer that was previously covered by the first sidewall spacer.

13. The method of claim 11, wherein the pattern defined by the exposed portion that is transferred to the underlying layer comprises a critical dimension less than about 20 nm.

14. The method of claim 10, wherein selectively removing comprises selectively removing at least three materials chosen from the group consisting of: the first material, the second material, the third material, the fourth material, and the fifth material from the multiline layer, and transferring a pattern defined by a remaining line into the underlying layer.

15. The method of claim 14, wherein the pattern defined by the remaining line that is transferred to the underlying layer comprises a critical dimension less than about 20 nm.

16. A method of patterning a substrate, the method comprising:
providing a substrate comprising mandrels made of a first material and positioned on an underlying layer, each of the mandrels comprising a first sidewall and a second sidewall opposite the first sidewall;

forming sidewall spacers made of a second material and comprising a first sidewall spacer abutting each respective first sidewall and a second sidewall spacer abutting each respective second sidewall, the mandrels extending vertically above top surfaces of the sidewall spacers;

forming first capped sidewall spacers by depositing a third material on the top surfaces of the first sidewall spacers without depositing the third material on the second sidewall spacers;

forming second capped sidewall spacers by depositing a fourth material on the top surfaces of the second sidewall spacers without depositing the fourth material on the first sidewall spacers, the fourth material having a different etch resistivity than the third material;

depositing a fifth material over the substrate, the fifth material covering exposed portions of the underlying layer between the first capped sidewall spacers and second capped sidewall spacers of adjacent mandrels to form lines of the fifth material, wherein the mandrels, first capped sidewall spacers, second capped sidewall spacers, and the lines of the fifth material together define a multiline layer;

cutting lines defined by the first capped sidewall spacers using a first patterned mask layer formed on the multiline layer; and selectively removing at least one of the first material, the second material, the third material, the fourth material, and the fifth material to uncover an exposed portion of the underlying layer.

17. The method of claim 16, further comprising:
cutting lines defined by the second capped sidewall spacers using a second patterned mask layer formed on the multiline layer.

18. The method of claim 16, further comprising:
transferring a pattern defined by the exposed portion of the underlying layer;
wherein the pattern defined by the exposed portion that is transferred to the underlying layer comprises a first critical dimension less than about 20 nm; and
wherein the first patterned mask layer comprises a second critical dimension about four times the first critical dimension.

19. The method of claim 18, wherein selectively removing comprises:
selectively removing the first material and the fifth material from the multiline layer; and
the pattern defined by the exposed portion that is transferred to the underlying layer comprises fins of a FinFET, each fin having a width less than about 20 nm.

20. The method of claim 16, wherein selectively removing comprises:
selectively removing at least three materials chosen from the group consisting of: the first material, the second material, the third material, the fourth material, and the fifth material from the multiline layer, and transferring a pattern defined by a remaining line into the underlying layer;
wherein the pattern defined by the exposed portion that is transferred to the underlying layer comprises a first critical dimension less than about 20 nm; and
wherein the first patterned mask layer comprises a second critical dimension about four times the first critical dimension.

* * * * *